United States Patent [19]
Camilletti et al.

[11] Patent Number: 5,609,925
[45] Date of Patent: Mar. 11, 1997

[54] CURING HYDROGEN SILSESQUIOXANE RESIN WITH AN ELECTRON BEAM

[75] Inventors: Robert C. Camilletti, Midland, Mich.; Irfan Saadat, Santa Clara; Michael Thomas, Milpitas, both of Calif.

[73] Assignees: Dow Corning Corporation, Midland, Mich.; National Semiconductor Corporation, Santa Clara, Calif.

[21] Appl. No.: 566,820

[22] Filed: Dec. 4, 1995

[51] Int. Cl.$^6$ ........................................................ B05D 3/06
[52] U.S. Cl. ........................... 427/503; 427/504; 427/552; 427/596; 427/96
[58] Field of Search .................................... 427/503, 504, 427/551, 552, 567, 596, 96

[56] References Cited

U.S. PATENT DOCUMENTS

| | | | |
|---|---|---|---|
| 4,571,349 | 2/1986 | Hockemeyer et al. | 428/447 |
| 4,756,977 | 7/1988 | Haluska et al. | 428/704 |
| 4,847,162 | 7/1989 | Haluska et al. | 428/457 |
| 5,059,448 | 10/1991 | Chandra et al. | 427/53.1 |
| 5,116,637 | 5/1992 | Baney et al. | 427/340 |
| 5,262,201 | 11/1993 | Chandra et al. | 427/376.2 |
| 5,336,532 | 8/1994 | Haluska et al. | 427/515 |
| 5,436,029 | 7/1995 | Ballance et al. | 427/126.2 |
| 5,481,135 | 1/1996 | Chandra et al. | 257/701 |

*Primary Examiner*—Shrive Beck
*Assistant Examiner*—Erma Cameron
*Attorney, Agent, or Firm*—Roger E. Gobrogge; Sharon K. Severance

[57] ABSTRACT

A low temperature method of forming silica-containing ceramic coatings on substrates in which a coating containing hydrogen silsesquioxane resin is applied on a substrate and exposed to an electron beam for a time sufficient to convert the hydrogen silsesquioxane resin to the silica-containing ceramic coating. This method is especially valuable for forming protective and dielectric coatings on electronic devices.

10 Claims, No Drawings

CURING HYDROGEN SILSESQUIOXANE RESIN WITH AN ELECTRON BEAM

This invention was made with Government support under MDA904-93-C-B100 awarded by the National Security Agency. The Government has certain rights in this invention.

BACKGROUND OF THE INVENTION

The present invention relates to a method of forming silica-containing ceramic coatings on substrates such as electronic devices. These coatings can be used as hermetic and/or dielectric layers.

The use of hydrogen silsesquioxane derived ceramic coatings on substrates such as electronic devices is known in the art. For instance, Haluska et al. in U.S. Pat. No. 4,756,977 disclose a process for forming silica-containing coatings on substrates such as electronic devices. The process described therein involves applying a solution of hydrogen silsesquioxane resin on a substrate followed by heating the coated substrate in air at a temperature in the range of 200°–1000° C. Such processes, however, can damage heat sensitive substrates by the temperature and time necessary for ceramification.

Other methods for converting hydrogen silsesquioxane resin to silica-containing materials at lower temperatures are also known in the art. For instance, U.S. Pat. No. 4,847,162 describes the conversion of hydrogen silsesquioxane resin to nitrified silica by heating in ammonia. Similarly, U.S. Pat. No. 5,059,448 describes the use of rapid thermal processing to convert hydrogen silsesquioxane resin to a silica containing ceramic. Finally, U.S. Pat. Nos. 5,116,637, 5,336,532, 5,262,201 and 5,436,029 describe the use of amines, ozone, wet ammonia, and nitrous oxide, respectively, to assist in the conversion of hydrogen silsesquioxane resin to silica-containing materials. Despite the lower thermal exposure of these processes, temperature sensitive substrates can still be damaged. Moreover, these processes are complicated by the additional equipment and materials which are required.

The present inventors have now discovered that hydrogen silsesquioxane resin can be converted to silica-containing coatings without significantly heating the underlying substrate by using an electron beam.

SUMMARY OF THE INVENTION

The present invention relates to a method of forming a silica-containing ceramic coating on a substrate. The method comprises first applying a coating comprising hydrogen silsesquioxane resin on the substrate. The coated substrate is then exposed to an electron beam to convert the hydrogen silsesquioxane resin coating to a silica-containing ceramic coating. This method is especially valuable for forming coatings on electronic devices.

DETAILED DESCRIPTION OF THE INVENTION

The present invention is based on the discovery that electron beams can be used in the conversion of hydrogen silsesquioxane resin coatings to silica-containing coatings. This discovery has an impact on the use of hydrogen silsesquioxane resin for coating temperature sensitive substrates such as electronic devices since the electron beam process can be tailored to inhibit appreciable temperature changes in the substrate.

Because the process of the present invention can form coatings at relatively low substrate temperatures, it is particularly valuable for the deposition of coatings on substrates such as electronic devices or electronic circuits which are temperature sensitive and which require high quality coatings. Such coatings could serve, for example, as protective or dielectric coatings, interlevel dielectric layers, doped dielectric layers to produce transistor like devices, pigment loaded binder systems containing silicon to produce capacitor and capacitor like devices, multilayer devices, 3-D devices, silicon on insulator devices, coatings for superconductors, super lattice devices and the like. The choice of substrates to be coated by the instant invention, however, is limited only by the need for thermal and chemical stability of the substrate under the conditions used. It is also contemplated, therefore, that the process of the invention could be used on nonelectronic substrates such as plastics including, for example, polyimides, epoxides, polytetrafluoroethylene and copolymers thereof, polycarbonates, acrylics, polyesters and the like.

As used in the present invention, the expression "silica-containing ceramic" is meant to include both amorphous silica ($SiO_2$) materials as well as amorphous silica-like materials that are not fully free of residual carbon, silanol (Si—OH) and/or hydrogen. The expressions "electronic device" or "electronic circuit" include, but are not limited to, silicon based devices, gallium arsenide based devices, focal plane arrays, opto-electronic devices, photovoltaic cells and optical devices.

In the present invention, a silica-containing ceramic coating is formed on a substrate by a process which comprises coating the substrate with a composition comprising hydrogen silsesquioxane resin and then exposing the coating to an electron beam.

The hydrogen silsesquioxane resins (H-resin) which may be used in this invention include hydridosiloxane resins of the formula $HSi(OH)_x(OR)_yO_{z/2}$, in which each R is independently an organic group or a substituted organic group which, when bonded to silicon through the oxygen atom, forms a hydrolyzable substituent, $x=0-2$, $y=0-2$, $z=1-3$, $x+y+z=3$. Examples of R include alkyls such as methyl, ethyl, propyl, butyl, etc., aryls such as phenyl, and alkenyls such as allyl or vinyl. As such, these resins may be fully condensed $(HSiO_{3/2})_n$ or they may be only partially hydrolyzed (i.e., containing some Si—OR) and/or partially condensed (i.e., containing some Si—OH). Although not represented by this structure, these resins may contain a small number (e.g., less than about 10%) of silicon atoms which have either 0 or 2 hydrogen atoms attached thereto due to various factors involved in their formation or handling.

The above H-resins and methods for their production are known in the art. For example, Collins et al. in U.S. Pat. No. 3,615,272, which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Patent Nos. 59-178749, 60-86017 and 63-107122, or any other equivalent hydridosiloxane, will also function herein.

It is to be noted that in a preferred embodiment of the invention, specific molecular weight fractions of the above H-resins may also be used in this process. Such fraction and methods for their preparation are taught by Hanneman et al. in U.S. Pat. No. 5,063,267 which is hereby incorporated by reference. A preferred fraction comprises material wherein at least 75% of the polymeric species have a molecular weight above about 1200 and a more preferred fraction comprises material wherein at least 75% of the polymeric species have a molecular weight between about 1200 and about 100,000.

The hydrogen silsesquioxane resin coating material may also contain other ceramic oxide precursors. Examples of such ceramic oxide precursors include compounds of various metals such as aluminum, titanium, zirconium, tantalum, niobium and/or vanadium as well as various non-metallic compounds such as those of boron or phosphorous which may be dissolved in solution, hydrolyzed, and subsequently pyrolyzed, at relatively low temperatures and relatively rapid reaction rates to form ceramic oxide coatings.

The above ceramic oxide precursor compounds generally have one or more hydrolyzable groups bonded to the above metal or non-metal, depending on the valence of the metal. The number of hydrolyzable groups to be included in these compounds is not critical as long as the compound is soluble in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, or other organic groups bonded to said metal or non-metal through an oxygen such as acetylacetonate. Specific compounds, therefore, include zirconium tetracetylacetonate, titanium dibutoxy diacetylacetonate, aluminum triacetylacetonate and tetraisobutoxy titanium.

When hydrogen silsesquioxane resin is to be combined with one of the above ceramic oxide precursors, generally it is used in an amount such that the final ceramic coating contains 70 to 99.9 percent by weight $SiO_2$.

The hydrogen silsesquioxane resin coating material may also contain a platinum, rhodium or copper catalyst to increase the rate and extent of conversion to silica. Generally, any platinum, rhodium or copper compound or complex which can be solubilized will be functional. For instance, a composition such as platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of hydrogen silsesquioxane resin.

According to the process of the invention, H-resin and, optionally, any ceramic oxide precursors and/or catalysts are applied to the surface of a substrate. This can be accomplished in any manner, but a preferred method involves dissolving the H-resin in a solvent to form a solution or dispersion which is applied to the surface of the substrate. Various facilitating measures such as stirring and/or heating may be used to dissolve or disperse the H-resin and create a more uniform application solution. Solvents which may be used include any agent or mixture of agents which will dissolve or disperse the H-resin to form a homogenous solution without affecting the resultant coating. These solvents can include, for example, aromatic hydrocarbons such as benzene or toluene, alkanes such as n-heptane or dodecane, ketones, esters, ethers, or cyclic dimethylpolysiloxanes, in an amount sufficient to dissolve the above materials to low solids. Generally, enough of the above solvent is used to form a 0.1–50 weight percent solution.

If a solution method is used, the solution comprising the H-resin, solvent, and, optionally, a modifying ceramic oxide precursor and/or a catalyst is then coated onto the substrate. The method of coating can be, but is not limited to, spin coating, dip coating, spray coating or flow coating. Other equivalent means such as vapor deposition, however, are also deemed to be within the scope of this invention.

The solvent is then allowed to evaporate from the coated substrate resulting in the deposition of the hydrogen silsesquioxane resin coating. Any suitable means of evaporation may be used such as simple air drying by exposure to an ambient environment, by the application of a vacuum or mild heat (eg., less than 50° C.) or during the early stages of the heat treatment. It is to be noted that when spin coating is used, the additional drying period is minimized as the spinning drives off the solvent.

Once the H-resin coating is applied, it is then exposed to the electron beam. Units for producing the electron beams are known in the art and commercially available. Generally, such units comprise a heated cathode (such as a tungsten filament) which cause electrons to be produced at a very high rate. The resultant electrons are then accelerated and concentrated in vacuum by a large voltage applied to the anode to form a high energy beam. The coating is heated by absorbing the kinetic energy of these bombarding electrons. Alternatively, cold cathode sources are useful and within the scope of the present invention.

Typically, the accelerating voltage in these units is in the range of about 0.1 to 100 keV, the vacuum is in the range of about 10 to $10^{-3}$ Pa, the electron currents range from about 0.1 milliamperes to 1 ampere and the power in the beam varies from about 0.1 watt to 1 kilowatt. The dose achieved by these means is in the range of about 100 microcoulomb to 100 coulomb/cm$^2$, preferably in the range of about 1 to 10 coulombs/cm$^2$.

The H-resin containing coating is generally exposed to the electron beam for a time effective to provide the dose required to convert the H-resin to silica. Generally, depending on the voltage, this can occur from within a range from about 10 seconds to 1 hour.

The inventors herein also unexpectedly discovered that the dose of the electron beam can have an impact on the properties of the coating. For instance, the inventors discovered that when the electron beam dose is increased at a constant accelerating voltage, the stress in the coating can be changed from tensile to compressive. As such, the processing can be tailored to form coatings with the desired properties.

Despite the high energy absorbed by the coating in this process, substrate temperatures are not appreciably affected. For instance, in a standard conversion process, substrate temperatures rarely reach 100° C. and are often less than 50° C.

If desired, the coating can be selectively exposed to the electron beam by, for example, the use of a mask to cure only portions of the coating. After exposure, the remainder of the coating (i.e., the uncured coating) can be removed (by, for example, rinsing with a solvent) to yield a patterned coating.

Additionally, it is within the scope of the present invention to anneal the coating cured with the electron beam in any desired environment. For instance, the coating can be heated at 50°–500° C. in an inert gas or an oxidizing gas for up to 72 hours. Such annealing can change the characteristics and properties of the coating.

In addition, the coating may be further planarized by, for example, heating before or during the electron beam exposure to cause the coating to melt and flow.

By the above methods a thin (less than 2 microns) silica-containing ceramic planarizing coating is produced on the substrate. The coating smooths the irregular surfaces of various substrates and has excellent adhesive properties. In addition, the coating may be covered by other coatings such as additional $SiO_2$ layers, silicon containing coatings, silicon carbon containing coatings, silicon nitrogen containing coatings, silicon oxygen nitrogen containing coatings and/or silicon nitrogen carbon containing coatings. Such multiple layer coatings are known in the art and many are described in U.S. Pat. No. 4,756,977 which is hereby incorporated by reference.

Coatings produced by the instant invention possess low defect density and are useful on electronic devices as protective coatings, as corrosion resistant and abrasion resistant coatings, as temperature and moisture resistant coatings, as dielectric layers and as a diffusion barrier against ionic impurities such as sodium and chloride.

The following non-limiting examples are included so that one skilled in the art may more readily understand the invention.

EXAMPLE 1

Hydrogen silsesquioxane resin made by the method of Collins et al. in U.S. Pat. No. 3,615,273 was diluted to 18 wt. % in methyl isobutylketone. The H-resin solution was applied to the surface of 150 mm silicon wafer by a spin-on process. The coating on the wafer was then exposed to electron beams as set forth in Table 1. The results are also set for in the Table. Note that substrate temperatures were in the 35°–45° C. range upon exposure.

TABLE 1

ELECTRON BEAM CURING OF HYDROGEN SILSESQUIOXANE RESIN

| | | CONVERSION CONDITION | | | | | | | | (g/cm3) |
|---|---|---|---|---|---|---|---|---|---|---|
| | | Acceleration | Dose | Thickness (A) | | | | | % | Film |
| ID | Description | Voltage (eV) | (uC/c) | Unconvert | StdDe | Convert | StdDe | Meas. R/ | Shrink | Density |
| 1 | Electron Cure | 800* | 100 | 5306 | 8 | 5520 | 17 | 1.37 | −4.0 | 1.542 |
| 2 | Electron Cure | 800* | 100 | 5278 | 36 | | | | 100.0 | ERR |
| 3 | Electron Cure | 800* | 100 | 5287 | 34 | | | | 100.0 | ERR |
| 4 | Electron Cure | 800* | 200 | 5293 | 37 | 5512 | 45 | 1.369 | −4.1 | 1.461 |
| 5 | Electron Cure | 800* | 200 | 5295 | 37 | | | | 100.0 | ERR |
| 6 | Electron Cure | 800* | 200 | 5299 | 32 | | | | 100.0 | ERR |
| 7 | Electron Cure | 800* | 300 | 5298 | 18 | 5514 | 29 | 1.368 | −4.1 | 1.439 |
| 8 | Electron Cure | 800* | 300 | 5069 | 16 | | | | 100.0 | ERR |
| 9 | Electron Cure | 800* | 300 | 5311 | 28 | 5544 | 25 | 1.366 | −4.4 | 1.317 |
| 10 | Electron Cure | 4600 | 100 | 5243 | 63 | 5106 | 42 | 1.401 | 2.6 | 1.509 |
| 11 | Electron Cure | 4600 | 100 | 5310 | 35 | 5162 | 32 | 1.401 | 2.8 | 1.526 |
| 12 | Electron Cure | 4600 | 100 | 5264 | 43 | 5127 | 55 | 1.4 | 2.6 | 1.503 |
| 13 | Electron Cure | 4600 | 200 | 5297 | 41 | 5009 | 26 | 1.418 | 5.4 | 1.561 |
| 14 | Electron Cure | 4600 | 200 | 5171 | 36 | 4911 | 18 | 1.426 | 5.0 | 1.604 |
| 15 | Electron Cure | 4600 | 200 | 5155 | 33 | 4918 | 19 | 1.431 | 4.6 | 1.590 |
| 16 | Electron Cure | 4600 | 300 | 5141 | 37 | 4871 | 31 | 1.43 | 5.3 | 1.653 |
| 17 | Electron Cure | 4600 | 300 | 5141 | 44 | 4879 | 32 | 1.428 | 5.1 | 1.638 |
| 18 | Electron Cure | 4600 | 300 | 5159 | 22 | 4882 | 17 | 1.432 | 5.4 | 1.484 |
| 19 | Electron Cure | 6800 | 100 | 5120 | 30 | 4885 | 22 | 1.421 | 4.6 | 1.648 |
| 20 | Electron Cure | 6800 | 100 | 5143 | 36 | 5017 | 21 | 1.407 | 2.4 | 1.570 |
| 21 | Electron Cure | 6800 | 100 | 5117 | 44 | 5005 | 47 | 1.409 | 2.2 | 1.494 |
| 22 | Electron Cure | 6800 | 200 | 5131 | 23 | 4904 | 42 | 1.42 | 4.4 | 1.700 |
| 23 | Electron Cure | 6800 | 200 | 5160 | 19 | 4933 | 24 | 1.419 | 4.4 | 1.644 |
| 24 | Electron Cure | 6800 | 200 | 5149 | 47 | 4931 | 40 | 1.421 | 4.2 | 1.714 |
| 25 | Electron Cure | 6800 | 300 | 5106 | 34 | 4805 | 12 | 1.432 | 5.9 | 1.771 |
| 28 | Electron Cure | 6800 | 300 | 5351 | 92 | 5052 | 99 | 1.429 | 5.6 | 1.753 |
| 27 | Electron Cure | 6800 | 300 | 5124 | 25 | 4818 | 33 | 1.433 | 6.0 | 2.053 |
| 31 | Electron Cure | 6800 | 300 | 5204 | 48 | 4738 | 46 | 1.448 | 9.0 | 1.711 |
| 32 | Electron Cure | 6800 | 300 | 5138 | 81 | 4652 | 93 | 1.451 | 9.5 | 1.669 |
| 33 | Electron Cure | 6800 | 300 | 5208 | 46 | 4704 | 49 | 1.451 | 9.7 | 1.736 |
| 34 | Electron Cure | 6800 | 600 | 5178 | 52 | 4541 | 51 | 1.473 | 12.3 | 1.710 |
| 35 | Electron Cure | 6800 | 600 | 5210 | 38 | 4704 | 133 | 1.465 | 9.7 | 1.773 |
| 36 | Electron Cure | 6800 | 600 | 5247 | 50 | 4649 | 69 | 1.465 | 11.4 | 1.744 |
| 37 | Electron Cure | 6800 | 900 | 5211 | 36 | 4479 | 52 | 1.489 | 14.0 | 1.874 |
| 38 | Electron Cure | 6800 | 900 | 5213 | 34 | 4503 | 24 | 1.485 | 13.6 | 2.082 |
| 39 | Electron Cure | 6800 | 900 | 5302 | 52 | 4591 | 49 | 1.478 | 13.4 | 1.979 |
| 26 | Unconverted | — | 0 | 5372 | 105 | 5537 | 126 | 1.38 | −3.1 | 1.527 |

| | | (remaining) | FT-IR | (wt/wt %) | (E + 08 dynes/cm2) | | DK | DF | Dielectric Properties | | (1–19 V) | |
|---|---|---|---|---|---|---|---|---|---|---|---|---|
| | | | | | Stress | | | | DK | DF | | |
| ID | Electron Cure | % SiH | % SiOH | % H2O | Initial | Aged | (100 Hz) | (100 Hz) | (1 MHz) | (1 MHz) | VR | DS |

TABLE 1-continued

ELECTRON BEAM CURING OF HYDROGEN SILSESQUIOXANE RESIN

| | | | | | | | | | | |
|---|---|---|---|---|---|---|---|---|---|---|
| 1 | Electron Cure | 98.79 | 0.76 | 0.00 | 3.53 | | | | | |
| 2 | Electron Cure | | | | | | | | | |
| 3 | Electron Cure | | | | | | | | | |
| 4 | Electron Cure | 99.88 | 0.73 | 0.00 | 2.68 | | | | | |
| 5 | Electron Cure | | | | | | | | | |
| 6 | Electron Cure | | | | | | | | | |
| 7 | Electron Cure | 100.00 | 0.87 | 0.00 | 3.30 | | | | | |
| 8 | Electron Cure | | | | | | | | | |
| 9 | Electron Cure | | | | 3.32 | | | | | — |
| 10 | Electron Cure | 78.50 | 1.15 | 0.00 | 4.51 | | | | | |
| 11 | Electron Cure | 76.20 | 1.12 | 0.00 | 4.13 | | | | | |
| 12 | Electron Cure | | | | 3.37 | 3.27 | 0.0026 | 3.25 | 0.0328 | 7.67E + 16 |
| 13 | Electron Cure | 64.67 | 2.19 | 0.28 | 3.54 | | | | | |
| 14 | Electron Cure | 67.85 | 2.03 | 0.24 | 1.65 | | | | | |
| 15 | Electron Cure | | | | 1.62 | 3.56 | 0.0002 | 3.48 | 0.0152 | 6.19E + 16 |
| 16 | Electron Cure | 63.26 | 2.62 | 0.48 | 0.59 | | | | | |
| 17 | Electron Cure | 59.91 | 2.65 | 0.41 | 0.96 | | | | | |
| 18 | Electron Cure | | | | 0.63 | 3.79 | 0.0004 | 3.60 | 0.041 | 2.78E + 16 |
| 19 | Electron Cure | 47.90 | 2.90 | 0.30 | 2.45 | | | | | |
| 20 | Electron Cure | 67.31 | 1.38 | 0.00 | 2.54 | | | | | |
| 21 | Electron Cure | | | | 1.89 | 3.51 | 0.0001 | 3.46 | 0.0484 | 2.81E + 17 |
| 22 | Electron Cure | 47.51 | 2.90 | 0.28 | 1.47 | | | | | |
| 23 | Electron Cure | 49.71 | 2.75 | 0.23 | 1.69 | | | | | |
| 24 | Electron Cure | | | | 1.37 | 4.11 | 0.0001 | 4.04 | 0.0373 | 7.29E + 16 |
| 25 | Electron Cure | 38.39 | 3.65 | 0.64 | | | | | | |
| 28 | Electron Cure | 36.97 | 3.35 | 0.47 | 0.23 | | | | | |
| 27 | Electron Cure | | | | −0.17 | 4.50 | 0.0007 | 4.35 | 0.0497 | 3.05E + 17 |
| 31 | Electron Cure | 37.00 | 4.76 | 1.01 | 16.28 | | | | | |
| 32 | Electron Cure | 39.60 | 4.58 | 0.88 | 0.36 | | | | | |
| 33 | Electron Cure | | | | 0.34 | 4.59 | 0.0015 | 4.42 | 0.0001 | 4.36E + 15 |
| 34 | Electron Cure | 32.50 | 5.96 | 1.54 | −4.21 | | | | | |
| 35 | Electron Cure | 32.20 | 5.15 | 1.11 | −4.55 | | | | | |
| 36 | Electron Cure | | | | −3.72 | 5.10 | 0.0021 | 4.73 | 0.0002 | 1.01E + 16 |
| 37 | Electron Cure | 30.90 | 4.95 | 1.36 | −6.47 | | | | | |
| 38 | Electron Cure | 30.80 | 4.45 | 1.10 | −6.29 | | | | | |
| 39 | Electron Cure | | | | −5.54 | 4.95 | 0.0007 | 4.68 | 0.0009 | 6.28E + 15 |
| 26 | Unconverted | 96.04 | 0.75 | 0.00 | 2.40 | | | | | |

EXAMPLE 2

(Comparative)

Hydrogen silsesquioxane resin made by the method of Collins et al. in U.S. Pat. No. 3,615,273 was diluted to 18 wt. % in methyl isobutylketone. The H-resin solution was applied to the surface of a silicon wafer by a spin-on process. The coated wafer was then placed in a 1 L 2 inch quartz tube furnace at 400° C. in Nitrogen for 1 hour. The resultant coating had the following characteristics: (note that substrate temperatures would be at 400° C.)

| | |
|---|---|
| Film Density | 1.4–1.45 g/cm$^3$ |
| Refractive Index | 1.38 |
| Stress | 1 × 10$^9$ (T) |
| Remaining SiH | >90% |
| SiOH | <0.5% |
| H$_2$O | 0.0% |

What is claimed is:

1. A method of forming a silica-containing ceramic coating on a substrate comprising:

applying a coating comprising hydrogen silsesquioxane resin on a substrate; and exposing the coated substrate to an electron beam for a time and at a dose effective to convert the hydrogen silsesquioxane resin coating to a silica-containing ceramic coating.

2. The method of claim 1 wherein the substrate is an electronic device.

3. The method of claim 1 wherein the electron beam dose is in the range of 100 microcoulomb to 100 coulomb/cm$^2$.

4. The method of claim 1 wherein the electron beam dose is in the range of 1 to 10 coulombs/cm$^2$.

5. The method of claim 1 wherein the time for electron beam exposure is in the range of 10 seconds to 1 hour.

6. The method of claim 1 wherein the hydrogen silsesquioxane resin coating also contains ceramic oxide precursors comprising a compound containing an element selected from the group consisting of titanium, zirconium, aluminum, tantalum, vanadium, niobium, boron and phosphorous wherein the compound contains at least one hydrolyzable substituent selected from the group consisting of alkoxy or acyloxy and the compound is present in an amount such that the silica-containing ceramic coating contains 0.1 to 30 percent by weight ceramic oxide precursor.

7. The method of claim 1 wherein the hydrogen silsesquioxane resin coating also contains a platinum or rhodium catalyst in an amount of between about 5 and about 1000 ppm platinum or rhodium based on the weight of hydrogen silsesquioxane resin.

8. The method of claim 1 wherein the coated substrate is selectively exposed to the electron beam to form a patterned coating.

9. The method of claim 1 wherein the coated substrate exposed to the electron beam is annealed for up to 72 hours at 50°–500° C. in an atmosphere selected from the group consisting of inert gas, oxidizing gas and reducing gas.

10. The method of claim 1 wherein the coating is heated before or during the electron beam exposure to cause it to melt and flow.

* * * * *